United States Patent
Yoshida et al.

(10) Patent No.: US 9,161,433 B2
(45) Date of Patent: Oct. 13, 2015

(54) POWER SUPPLY CONTROL CIRCUIT MODULE

(75) Inventors: Masato Yoshida, Nagaokakyo (JP);
Tomohiro Nagai, Nagaokakyo (JP);
Hiroshi Matsubara, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 177 days.

(21) Appl. No.: 13/602,612

(22) Filed: Sep. 4, 2012

(65) Prior Publication Data

US 2013/0063902 A1 Mar. 14, 2013

(30) Foreign Application Priority Data

Sep. 9, 2011 (JP) .................................. 2011-196610

(51) Int. Cl.
*H05K 7/00* (2006.01)
*H05K 1/02* (2006.01)

(52) U.S. Cl.
CPC .... *H05K 1/0209* (2013.01); *H01L 2224/16225* (2013.01); *H01L 2924/15192* (2013.01); *H01L 2924/19105* (2013.01); *H05K 1/0265* (2013.01); *H05K 2201/0715* (2013.01); *H05K 2201/09727* (2013.01)

(58) Field of Classification Search
CPC ....................................................... H05K 7/00
USPC ........... 361/760, 709, 748, 783; 147/252, 262
See application file for complete search history.

(56) References Cited

U.S. PATENT DOCUMENTS

| | | | |
|---|---|---|---|
| 6,797,890 B2 * | 9/2004 | Okubora et al. ............... | 174/260 |
| 7,176,756 B2 * | 2/2007 | Abe et al. ......................... | 330/66 |
| 2004/0169294 A1 | 9/2004 | Kanayama et al. | |
| 2005/0068748 A1 * | 3/2005 | Ogawa ........................... | 361/748 |
| 2009/0225525 A1 * | 9/2009 | Mano et al. .................... | 361/760 |
| 2010/0061071 A1 | 3/2010 | Watanabe | |

FOREIGN PATENT DOCUMENTS

JP 09-215324 A 8/1997
JP 09215324 A * 8/1997
(Continued)

OTHER PUBLICATIONS

Official Communication issued in corresponding Japanese Patent Application No. 2011-196610, mailed on Oct. 8, 2013.
(Continued)

*Primary Examiner* — Jenny L Wagner
*Assistant Examiner* — Michael P McFadden
(74) *Attorney, Agent, or Firm* — Keating & Bennett, LLP

(57) ABSTRACT

A power supply control IC is mounted on a surface of a multilayer body that defines a power supply control circuit module. A first inner-layer electrode connecting an inductor element and a switching regulator element for the power supply control IC, another first inner-layer electrode connecting the inductor element and a capacitor element, and still another first inner-layer electrode connecting the switching regulator element and the capacitor element are located on upper layer regions of the multilayer body and are routed in between a mounting area of the power supply control IC and a peripheral wall of the multilayer body. The first inner-layer electrodes have widths that are wider than those of second inner-layer electrodes which are located near a center region of the multilayer body and transmit control signals.

5 Claims, 5 Drawing Sheets

(56) References Cited

FOREIGN PATENT DOCUMENTS

| | | |
|---|---|---|
| JP | 2003-101222 A | 4/2003 |
| JP | 2004-140968 A | 5/2004 |
| JP | 2005-235808 A | 9/2005 |
| JP | 2009-231606 A | 10/2009 |
| JP | 2011-193724 A | 9/2011 |

OTHER PUBLICATIONS

Official Communication issued in corresponding Japanese Patent Application No. 2011-196610, mailed on Jun. 3, 2014.

* cited by examiner

POWER SUPPLY CONTROL CIRCUIT MODULE

BACKGROUND OF THE INVENTION

1. Field of the Invention

The present invention relates to power supply control circuit modules including a plurality of switching regulators.

2. Description of the Related Art

At present, higher packing densities of circuit elements are required for circuit modules for use in communication devices. Thus, such a circuit module is generally made from a multilayer body, which is formed by stacking a plurality of dielectric layers that include electrode patterns, and surface-mount type electronic components which are to be mounted on the multilayer body.

In such a circuit module for use in a communication device, a communication control circuit and a power supply control circuit are formed in the multilayer body, as illustrated in Japanese Unexamined Patent Application Publication No. 2009-231606. The communication control circuit includes a communication control IC element mounted on a surface of the multilayer body. The power supply control circuit includes a DC-DC converter switching IC element mounted on the surface of the multilayer body.

In this conventional circuit module, heat dissipation efficiency of the DC-DC converter switching IC element is being increased by mounting the DC-DC converter switching IC element on the surface of the multilayer body, namely the surface on a side opposite to a side facing a mother board when the multilayer body is mounted thereon.

In the foregoing conventional circuit module, however, electrode patterns for connecting the DC-DC converter switching IC element to other circuit elements are determined based on positional relationships between the DC-DC converter switching IC element and the other circuit elements. Thus, depending on the positional relationship, there may be a case where the heat dissipation of the whole DC-DC converter circuit is not adequate, not only in the DC-DC converter switching IC element but also in the electrode patterns, etc, which is positioned on a output side of the DC-DC converter switching IC element and through which large currents flow.

SUMMARY OF THE INVENTION

Accordingly, preferred embodiments of the present invention provide highly efficient heat dissipation in a power supply control circuit module that includes power supply control IC elements such as a DC-DC converter switching IC element, etc., and circuit patterns and circuit elements through which large currents generated in the power supply control IC elements flow.

A power supply control circuit module according to a preferred embodiment of the present invention includes a power supply control IC element that controls a power supply output based on a control signal and a multilayer body including a plurality of dielectric layers stacked on each other. The power supply control IC element and circuit elements that are connected to the power supply control IC element are mounted on a surface of the multilayer body. Connection circuit electrodes that connect the power supply control IC element and the circuit elements are defined by the first inner-layer electrodes.

First inner-layer electrodes are located between a mounting area of the power supply control IC element and a periphery of the surface of the multilayer body. Furthermore, second inner-layer electrodes that transmit the control signal for the power supply control IC element are also provided.

According to the foregoing arrangement, the first inner-layer electrodes are arranged closer to the periphery of the multilayer body than the mounting area of the power supply control IC element. Thus, heat generated at the first inner-layer electrodes is easily be dissipated to outside.

Furthermore, in the power supply control circuit module according to a preferred embodiment of the present invention, it is preferable that the multilayer body includes DC output terminals and the first inner-layer electrodes are all electrically connected to the DC output terminals.

This arrangement indicates a specific relationship between the first inner-layer electrodes and the DC output terminals. Since the first inner-layer electrodes are connected to the DC output terminals, large currents flow through the first inner-layer electrodes. However, formation structures of the first inner-layer electrodes provide a superior heat dissipation property.

Furthermore, in the power supply control circuit module according to a preferred embodiment of the present invention, it is preferable that cross-sectional areas of the first inner-layer electrodes are larger than cross-sectional areas of the second inner-layer electrodes.

This arrangement indicates a specific structure example of the first inner-layer electrode. The first inner-layer electrodes have cross sectional areas larger than those of the second inner-layer electrodes, and thus have smaller conductor loss and better heat dissipation property.

Furthermore, in the power supply control circuit module according to a preferred embodiment of the present invention, it is preferable that the circuit elements connected in between the power supply control IC element and the DC output terminals are mounted in between the mounting area of the power supply control IC element and the periphery of the surface of the multilayer body.

This arrangement improves the heat dissipation efficiency of the circuit elements, through which large currents flow.

Furthermore, in the power supply control circuit module according to a preferred embodiment of the present invention, it is preferable that the first inner-layer electrodes and the second inner-layer electrodes are provided in different layers of the multilayer body.

According to this arrangement, heat generated at the first inner-layer electrodes hardly propagates to the second inner-layer electrodes. Furthermore, noises superimposed on the first inner-layer electrodes are hard to superimpose on the control signal propagating though the second inner-layer electrodes.

Furthermore, in the power supply control circuit module according to a preferred embodiment of the present invention, it is preferable that the first inner-layer electrodes are provided in one or more layers which are closer to the surface of the multilayer body than a layer where the second inner-layer electrodes are provided.

In this arrangement, the first inner-layer electrodes are arranged near the surface of the multilayer body. Thus, heat is dissipated easier.

Furthermore, in the power supply control circuit module according to a preferred embodiment of the present invention, it is preferable to have the following arrangements: a plurality of external connection terminals are arrayed in a plurality of rows along the periphery of the multilayer body on a back surface of the multilayer body. Of the plurality of external connection terminals included in an array, external connection terminals that connect to the circuit elements and external connection terminals that connect to the first inner-layer electrodes are arranged in outermost positions.

According to these arrangements, paths through which large currents flow are arranged near the periphery of the multilayer body. Thus, the heat dissipation efficiency further improves.

Furthermore, in the power supply control circuit module according to a preferred embodiment of the present invention, it is preferable to have the following arrangements: the power supply control IC element is a DC-DC converter switching IC element. Of the circuit elements, an output capacitor is connected to an external ground connection terminal at one end through a conductive via hole, the output capacitor being connected to an output side of the DC-DC converter switching IC element, the external ground connection terminal being one of the external connection terminals on the back surface of the multilayer body.

According to this arrangement, the heat dissipation efficiency of a transmission path connecting to the output capacitor improves, and the parasitic inductance with regard to the output capacitor is significantly suppressed.

Furthermore, in the power supply control circuit module according to a preferred embodiment of the present invention, it is preferable that the surface of the multilayer body is shielded with a shielding member that has a thermal conductivity higher than that of air.

This arrangement improves the heat dissipation efficiency of each elements mounted on the surface of the multilayer body.

According to the preferred embodiments of the present invention, a power supply control circuit module having high heat dissipation efficiency is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
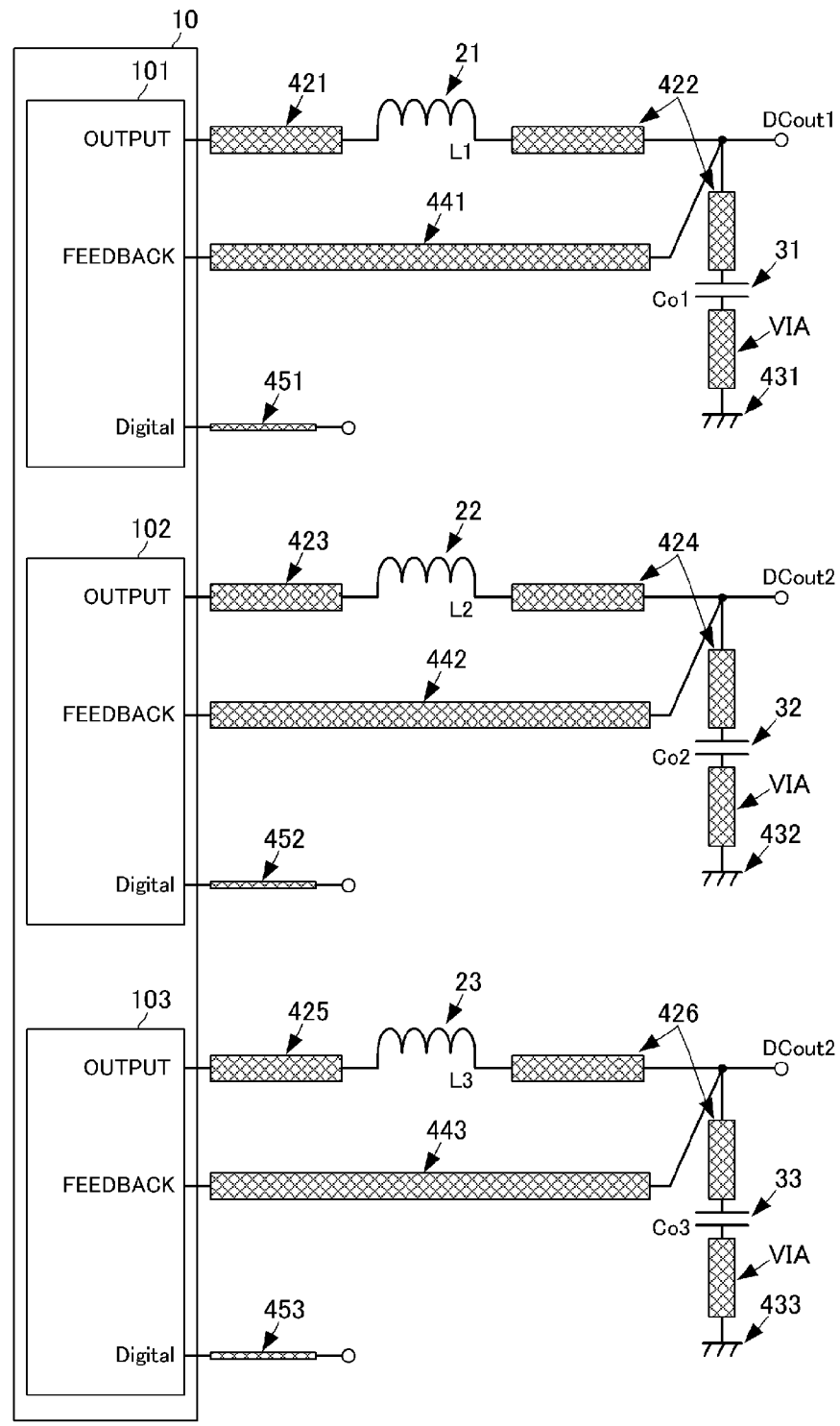
FIG. 1 is a view illustrating a circuit configuration and a connection configuration on an output side of a DC-DC converter circuit embedded in a power supply control circuit module according to a first preferred embodiment of the present invention.
Figure 2A:
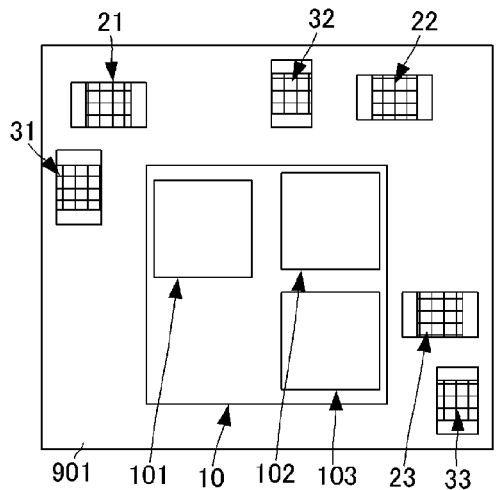
FIGS. 2A-2D are planar views of top four layers of a power supply control circuit module according to the first preferred embodiment of the present invention.
Figure 2B:
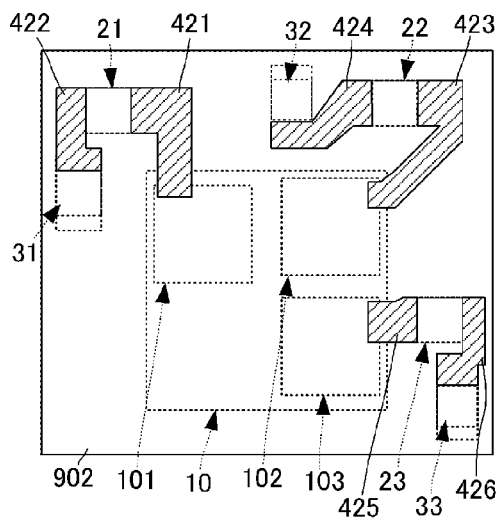
Figure 2C:
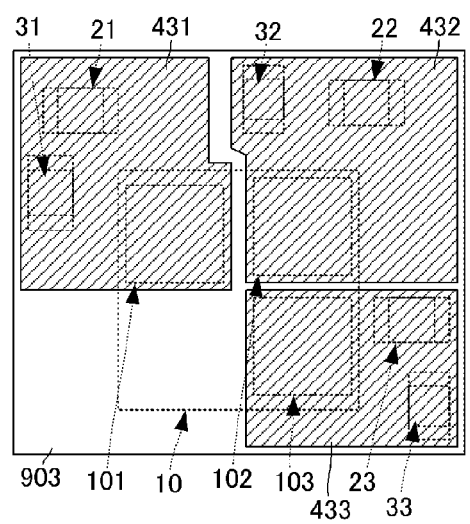
Figure 2D:
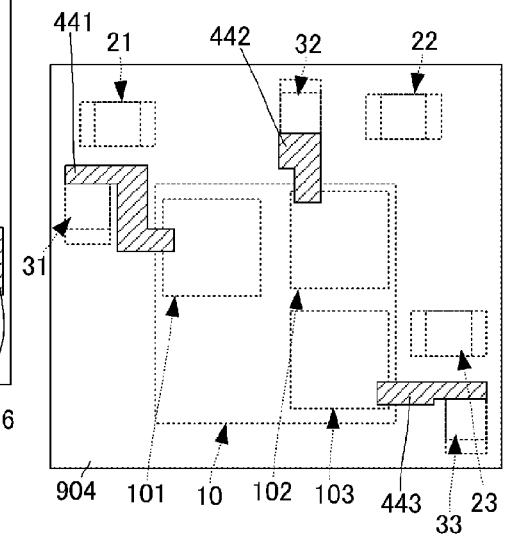
Figure 3A:
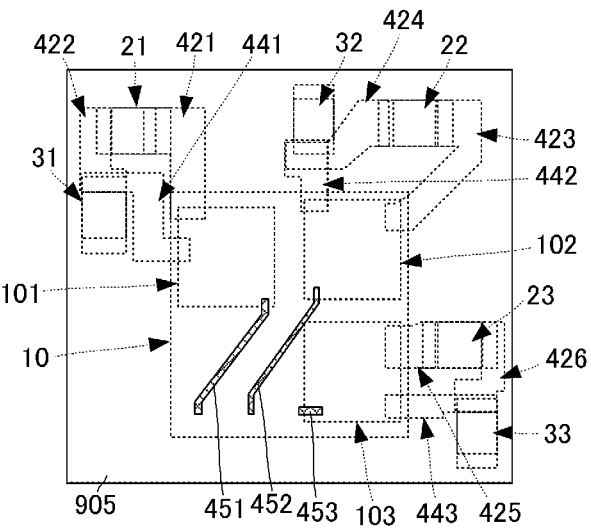
FIGS. 3A-3C are planar views of fifth and sixth layers of a power supply control circuit module according to the first preferred embodiment of the present invention.
Figure 3B:
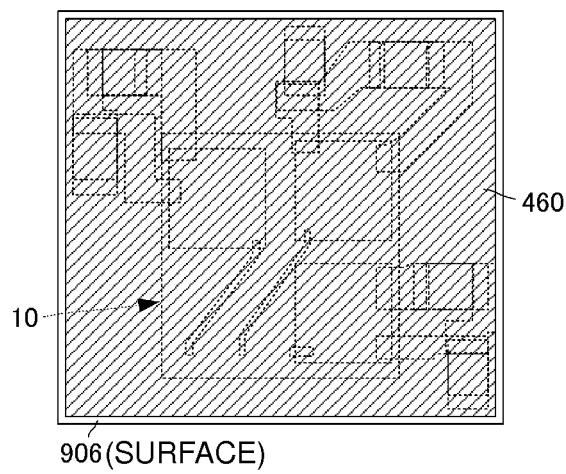
Figure 3C:
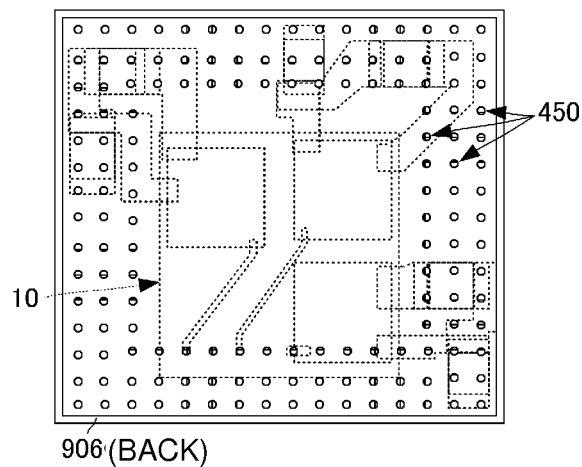

A power supply control circuit module according to preferred embodiments of the present invention is described with reference to the drawings. FIG. 1 is a view illustrating a circuit configuration and a connection configuration on an output side of a DC-DC converter circuit embedded in a power supply control circuit module 1 according to a first preferred embodiment. FIGS. 2A-2D are planar views of top four layers of the power supply control circuit module 1 according to the first preferred embodiment. FIGS. 3A-3C are planar views of the fifth and sixth layers of the power supply control circuit module 1 according to the first preferred embodiment. In FIGS. 2A-2D and 3A-3C, illustrations of conductive via holes are omitted.

The power supply control circuit module 1 preferably includes three DC-DC converter circuits, as illustrated in FIG. 1, for example. Although an example with three DC-DC converter circuits is described in the present preferred embodiment, the number of the DC-DC converter circuits is not limited to three, and any other number of the DC-DC converter circuits may be used.

The DC-DC converter circuits include switching regulator elements 101, 102, 103. The switching regulator elements 101, 102, 103 are fabricated to define a single unit of a power supply control IC 10, and receive an input power supply.

An OUTPUT terminal of the switching regulator element 101 is connected to one end of an inductor element 21. The other end of the inductor element 21 is connected to a DC output terminal DCout1. The other end of the inductor element 21 is also connected to a ground through a capacitor element 31. Furthermore, the other end of the inductor element 21 is connected to a FEEDBACK terminal of the switching regulator element 101. A Digital terminal of the switching regulator element 101 receives an input of a first control signal.

An OUTPUT terminal of the switching regulator element 102 is connected to one end of an inductor element 22. The other end of the inductor element 22 is connected to a DC output terminal DCout2. The other end of the inductor element 22 is also connected to the ground through a capacitor element 32. Furthermore, the other end of the inductor element 22 is connected to a FEEDBACK terminal of the switching regulator element 102. A Digital terminal of the switching regulator element 102 receives an input of a second control signal.

An OUTPUT terminal of the switching regulator element 103 is connected to one end of an inductor element 23. The other end of the inductor element 23 is connected to a DC output terminal DCout3. The other end of the inductor element 23 is also connected to the ground through a capacitor element 33. Furthermore, the other end of the inductor element 23 is connected to a FEEDBACK terminal of the switching regulator element 103. A Digital terminal of the switching regulator element 103 receives an input of a third control signal.

The power supply control circuit module 1 having the foregoing circuit configuration is realized with a multilayer body 900 as illustrated in FIGS. 2A-2D, FIGS. 3A-3C, and FIG. 4, and electronic components to be mounted on the multilayer body 900. The multilayer body 900 is preferably formed by stacking six layers of dielectric layers 901, 902, 903, 904, 905, and 906, for example. The number of layers may be arbitrarily determined according to a specification or preference. On a surface of the multilayer body 900 (surface of the dielectric layer 901), the power supply control IC 10 provided with external terminals, the inductor elements 21, 22, 23, the capacitor elements 31, 32, 33, all of which are of surface-mount type, are mounted.

More specifically, the power supply control IC 10 is mounted at substantially the center of the surface of the multilayer body 900. The inductor element 21 and the capacitor element 31 connected to the switching regulator element 101 are mounted on a peripheral side of the multilayer body 900 beyond positions where the external terminals of the switching regulator element 101 are mounted. The inductor element 22 and the capacitor element 32 connected to the switching regulator element 102 are mounted on a peripheral side of the multilayer body 900 beyond positions where the external terminals of the switching regulator element 102 are mounted. The inductor element 23 and the capacitor element 33 connected to the switching regulator element 103 are mounted on a peripheral side of the multilayer body 900 beyond positions where the external terminals of the switching regulator element 103 are mounted.

These inductor elements 21, 22, 23 and the capacitor elements 31, 32, 33 are connected to the output sides of the switching regulator elements 101, 102, 103, and larger currents flow through these elements compared to digital circuit elements, which will be described below. For example, a large current of, for example, about 10 mA or more flows. Heat is dissipated more easily by arranging such circuit elements on the sides closer to the periphery than the center of the multilayer body 900.

On a surface of the dielectric layer 902 (back surface of the dielectric layer 901) which is the second layer of the multilayer body 900 from the top, first inner-layer electrodes 421, 422, 423, 424, 425, 426 are formed. The first inner-layer electrodes 421-426 are arranged so as not to overlap each other in a planar view of the multilayer body 900 (viewed in a stacking direction) except an area where the power supply control IC 10 is mounted.

One end of the first inner-layer electrode 421 is connected to the OUTPUT terminal of the switching regulator element 101 through a conductive via hole formed in the dielectric layer 901. The first inner-layer electrode 421 preferably has a shape such that the first inner-layer electrode 421 is routed from the one end thereof, namely a position directly below the OUTPUT terminal of the switching regulator element 101, toward the periphery of the multilayer body 900. The other end of the first inner-layer electrode 421 is connected to one end of the inductor element 21 through a conductive via hole formed in the dielectric layer 901.

The other end of the inductor element 21 is connected to one end of the first inner-layer electrode 422 through a conductive via hole formed in the dielectric layer 901. The other end of the first inner-layer electrode 422 is connected to one end of the capacitor element 31 through a conductive via hole formed in the dielectric layer 901.

One end of the first inner-layer electrode 423 is connected to the OUTPUT terminal of the switching regulator element 102 through a conductive via hole formed in the dielectric layer 901. The first inner-layer electrode 423 preferably has a shape such that the first inner-layer electrode 423 is routed from the one end thereof, namely a position directly below the OUTPUT terminal of the switching regulator element 102, toward the periphery of the multilayer body 900. The other end of the first inner-layer electrode 423 is connected to one end of the inductor element 22 through a conductive via hole formed in the dielectric layer 901.

The other end of the inductor element 22 is connected to one end of the first inner-layer electrode 424 through a conductive via hole formed in the dielectric layer 901. The other end of the first inner-layer electrode 424 is connected to one end of the capacitor element 32 through a conductive via hole formed in the dielectric layer 901.

One end of the first inner-layer electrode 425 is connected to the OUTPUT terminal of the switching regulator element 103 through a conductive via hole formed in the dielectric layer 901. The first inner-layer electrode 425 preferably has a shape such that the first inner-layer electrode 425 is routed from the one end thereof, namely a position directly below the OUTPUT terminal of the switching regulator element 103, toward the periphery of the multilayer body 900. The other end of the first inner-layer electrode 425 is connected to one end of the capacitor element 23 through a conductive via hole formed in the dielectric layer 901.

The other end of the inductor element 23 is connected to one end of the first inner-layer electrode 426 through a conductive via hole formed in the dielectric layer 901. The other end of the first inner-layer electrode 426 is connected to one end of the capacitor element 33 through a conductive via hole formed in the dielectric layer 901.

These first inner-layer electrodes 421-426 preferably are formed so as to have widest possible widths. Thus, cross-sectional areas of these first inner-layer electrodes 421-426 may be made larger. Accordingly, conductor loss decreases and heat dissipation efficiency is improved.

Furthermore, it is advantageous to have more number of the conductive vie holes at connections of these first inner-layer electrodes 421-426. According to this arrangement, the heat dissipation efficiency by a group of the conductive via holes is improved.

Furthermore, it is desirable to route the first inner-layer electrodes 421-426 along near the periphery of the multilayer body 900 as close as possible. According to this arrangement, the heat dissipation efficiency is further improved.

Furthermore, as in the foregoing arrangement, the conductor loss is decreased and the heat dissipation efficiency is improved by forming these first inner-layer electrodes 421-426 so as to have thickest possible thicknesses.

On a surface of the dielectric layer 903 (back surface of the dielectric layer 902) which is the third layer of the multilayer body 900 from the top, inner-layer ground electrodes 431, 432, 433 are provided.

The inner-layer ground electrode 431 preferably has a shape such that the inner-layer ground electrode 431 covers mounting areas of the switching regulator element 101, the inductor element 21, and the capacitor element 31 in the planar view of the multilayer body 900. The inner-layer ground electrode 431 is connected to a ground terminal of the switching regulator element 101 through a conductive via hole that penetrates the dielectric layers 901 and 902. Furthermore, the inner-layer ground electrode 431 is connected to the other end of the capacitor element 31 through a conductive via hole that penetrates the dielectric layers 901 and 902. It is preferable to include a plurality of conductive via holes to connect the inner-layer ground electrode 431 and the other end of the capacitor element 31.

The inner-layer ground electrode 432 preferably has a shape such that the inner-layer ground electrode 432 covers mounting areas of the switching regulator element 102, the inductor element 22, and the capacitor element 32 in a planar view of the multilayer body 900. The inner-layer ground electrode 432 is connected to a ground terminal of the switching regulator element 102 through a conductive via hole that penetrates the dielectric layers 901 and 902. Furthermore, the inner-layer ground electrode 432 is connected to the other end of the capacitor element 32 through a conductive via hole that penetrates the dielectric layers 901 and 902. It is preferable to include a plurality of conductive via holes to connect the inner-layer ground electrode 432 and the other end of the capacitor element 32.

The inner-layer ground electrode 433 preferably has a shape such that the inner-layer ground electrode 433 covers mounting areas of the switching regulator element 103, the inductor element 23, and the capacitor element 33 in the planar view of the multilayer body 900. The inner-layer ground electrode 433 is connected to a ground terminal of the switching regulator element 103 through a conductive via hole that penetrates the dielectric layers 901 and 902. Furthermore, the inner-layer ground electrode 433 is connected to the other end of the capacitor element 33 through a conductive via hole that penetrates the dielectric layers 901 and 902. It is preferable to include a plurality of conductive via holes to connect the inner-layer ground electrode 433 and the other end of the capacitor element 33.

On a surface of the dielectric layer 904 (back surface of the dielectric layer 903) which is the fourth layer of the multilayer body 900 from the top, first inner-layer electrodes 441, 442, 443 are provided.

One end of the first inner-layer electrode 441 is connected to one end of the capacitor element 31 through a conductive via hole that penetrates the dielectric layers 901, 902, 903. The other end of the first inner-layer electrode 441 is connected to the FEEDBACK terminal of the switching regulator element 101 through a conductive via hole that penetrates the dielectric layers 901, 902, 903.

One end of the first inner-layer electrode 442 is connected to one end of the capacitor element 32 through a conductive via hole that penetrates the dielectric layers 901, 902, 903. The other end of the first inner-layer electrode 442 is connected to the FEEDBACK terminal of the switching regulator element 102 through a conductive via hole that penetrates the dielectric layers 901, 902, 903.

One end of the first inner-layer electrode 443 is connected to one end of the capacitor element 33 through a conductive via hole that penetrates the dielectric layers 901, 902, 903. The other end of the first inner-layer electrode 443 is connected to the FEEDBACK terminal of the switching regulator element 103 through a conductive via hole that penetrates the dielectric layers 901, 902, 903.

Here, these first inner-layer electrodes 441, 442, 443 are routed in such a way that these first inner-layer electrodes 441, 442, 443 do not overlap the mounting area of the power supply control IC 10 as much as possible except their respective other ends. Furthermore, these first inner-layer electrodes 441, 442, 443 are preferably formed so as to have widest possible widths. Thus, the conductor loss is decreased and the heat dissipation efficiency may is improved.

On a surface of the dielectric layer 905 (back surface of the dielectric layer 904) which is the fifth layer of the multilayer body 900 from the top, second inner-layer electrodes 451, 452, 453 are provided.

One end of the second inner-layer electrode 451 is connected to the Digital terminal of the switching regulator element 101 through a conductive via hole that penetrates the dielectric layers 901, 902, 903, 904. The other end of the second inner-layer electrode 451 is connected to an external connection terminal that inputs the first control signal, which is provided on a back surface of multilayer body 900, through a conductive via hole that penetrates the dielectric layers 905 and 906.

One end of the second inner-layer electrode 452 is connected to the Digital terminal of the switching regulator element 102 through a conductive via hole that penetrates the dielectric layers 901, 902, 903, 904. The other end of the second inner-layer electrode 452 is connected to an external connection terminal that inputs the second control signal, which is provided on the back surface of multilayer body 900, through a conductive via hole that penetrates the dielectric layers 905 and 906.

One end of the second inner-layer electrode 453 is connected to the Digital terminal of the switching regulator element 103 through a conductive via hole that penetrates the dielectric layers 901, 902, 903, 904. The other end of the second inner-layer electrode 453 is connected to an external connection terminal for inputting the third control signal, which is provided on the back surface of multilayer body 900, through a conductive via hole that penetrates the dielectric layers 905 and 906.

These second inner-layer electrodes 451, 452, 453 are lines that transmit control signals that are signals in digital form, and have narrower widths compared to the first inner-layer electrodes 421-426, 441-443. Furthermore, these second inter-layer electrodes 451, 452, 453 are routed within the mounting area of the power supply control IC 10 in the planar view of the multilayer body 900. Thus, the routing of the first inner-layer electrodes 421-426, 441-443 may be performed more easily. Furthermore, only the control signals flow through the second inner-layer electrodes 451-453. Thus, amounts of currents flowing through the second inner-layer electrodes 451-453 are small, and heats generated therefrom are negligible. Accordingly, arranging these second inner-layer electrodes 451-453 in a center area of the multilayer body 900 does not exacerbate the heat dissipation efficiency.

Furthermore, the second inner-layer electrodes 451-453 and the first inner-layer electrodes 421-426, 441-443 do not face to each other in the stacking direction. Thus, electromagnetic couplings between the second inner-layer electrodes 451-453 and the first inner-layer electrodes 421-426, 441-443 are prevented. According to this arrangement, it is possible to prevent noises superimposed on the first inner-layer electrodes 421-426, 441-443 from superimposing on the control signals transmitting through the second inner-layer electrodes 451-453. Furthermore, conversely, noises superimposed on the control signals transmitting through the second inner-layer electrodes 451-453 are prevented from affecting signals transmitting through the first inner-layer electrodes 421-426.

On a surface of the dielectric layer 906 (back surface of the dielectric layer 904) which is the sixth layer (the bottom layer) of the multilayer body 900 from the top, an inner-layer ground electrode 460 is arranged so as to cover substantially the whole surface.

On a back surface of the dielectric layer 906, for example, three rows of external connection terminals 450 are arranged along the periphery of the multilayer body 900. Although no detailed illustration is provided, these external connection terminals 450 are connected to predetermined electrodes through conductive via holes that penetrate at least the dielectric layer 906. Furthermore, the external connection terminals 450 include DC output terminals of the plurality of DC-DC converter circuit, each of which includes the switching regulator element. These DC output terminals are connected to the first inner-layer electrodes.

Figure 4:
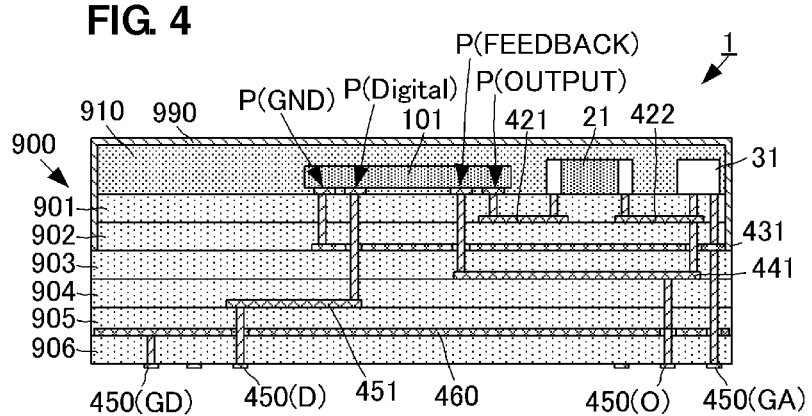
FIG. 4 is a side cross-sectional concept view for describing a multilayer structure of a power supply control circuit module according to the first preferred embodiment of the present invention.

The power supply control circuit module 1 having the arrangement described above has a structure as illustrated in FIG. 4 when viewed from a side. FIG. 4 is a side cross-sectional concept view for describing a multilayer structure of the power supply control circuit module 1 according to the first preferred embodiment. Note that FIG. 4 does not illustrate a cross-section of the multilayer body 900 along a plane in the stacking direction. FIG. 4 is a view illustrating connecting relations among the circuit elements, the electrodes, and the conductive via holes in an easily understandable form, and may include parts different from FIGS. 2A-2D and FIGS. 3A-3C. Furthermore, FIG. 4 only illustrates the connection configuration on the output side of the DC-DC converter circuit including the switching regulator element 101.

As illustrated in FIG. 4, the OUTPUT terminal of the switching regulator element 101 mounted on the surface of the multilayer body 900 is connected to one end of the first inner-layer electrode 421 at a boundary between the dielectric layers 901 and 902 through the conductive via hole that penetrates the dielectric layer 901. The first inner-layer electrode 421 is routed from its one end toward the periphery of the multilayer body 900. The other end of the first inner-layer electrode 421 is connected to one end of the inductor element 21 mounted on the surface of the multilayer body 900 through the conductive via hole that penetrates the dielectric layer 901. The other end of the inductor element 21 is connected to one end of the first inner-layer electrode 422 at the boundary between the dielectric layers 901 and 902 through the conductive via hole that penetrates the dielectric layer 901. The first inner-layer electrodes 422 is routed at a position close to a peripheral edge of the multilayer body 900 within a range that does not overlap the mounting area of the power supply control IC 10. These first inner-layer electrodes 421 and 422 have wide widths.

The other end of the first inner-layer electrode 422 is connected to one end of the capacitor element 31 mounted on the surface of the multilayer body 900 through the conductive via hole that penetrates the dielectric layer 901. Furthermore, the other end of the first inner-layer electrode 422 is also connected to one end of the first inner-layer electrode 441 at a boundary between the dielectric layers 903 and 904 through the conductive via hole that penetrates the dielectric layers 902 and 903. The other end of the first inner-layer electrode 441 is connected to the FEEDBACK terminal of the switching regulator element 101 through the conductive via hole that penetrates the dielectric layers 901, 902, 903. The first inner-layer electrode 441 also has a wide width as with the first inner-layer electrodes 421 and 422.

The first inner-layer electrode 441 is connected to an external connection output terminal 450(O) at the back surface of the multilayer body 900 through the conductive via hole that penetrates the dielectric layers 904, 905, 906.

The ground terminal of the switching regulator element 101 and the other end of the capacitor element 31 are each connected to the inner-layer ground electrode 431 at a boundary between the dielectric layers 902 and 903 through the conductive via hole that penetrates the dielectric layers 901, 902. The inner-layer ground electrode 431 is connected to an external connection ground terminal 450(GA) at the back surface of the multilayer body 900 through the conductive via hole that penetrates the dielectric layers 903, 904, 905, 906. Here, it is more preferable to have a plurality of the external connection ground terminals 450(GA) and connect these with the inner-layer ground electrode 431 using a plurality of conductive via holes.

The Digital terminal of the switching regulator element 101 is connected to one end of the second inner-layer electrode 451 at a boundary between the dielectric layers 904 and 905 through the conductive via hole that penetrates the dielectric layers 901, 902, 903, 904. The other end of the second inner-layer electrode 451 is connected to an external connection digital input terminal 450(D) at the back surface of the multilayer body 900 through the conductive via hole that penetrates the dielectric layers 905, 906.

The inner-layer ground electrode 460 at a boundary between the dielectric layers 905 and 906 is connected to an external connection digital ground terminal 450(GD) at the back surface of the multilayer body 900 through the conductive via hole that penetrates the dielectric layer 906.

According to the foregoing structure, the circuit elements and the connection electrodes through which large currents flow are arranged on the peripheral side of the multilayer body 900 beyond the mounting area of the power supply control IC 10 in the multilayer body 900. Thus, heat paths up to external radiation are short, and the heat dissipation efficiency improves. Furthermore, the heat dissipation efficiency further improves by making these large-current-flowing connection electrodes wider. Furthermore, these large-current-flowing connection electrodes are arranged on upper layers of the multilayer body 900. Thus, heat is hardly confined inside the multilayer body 900, and the heat dissipation efficiency improves. Accordingly, a small power supply control circuit module having superior heat dissipation efficiency is provided.

Furthermore, the heat dissipation efficiency further improves by having a shielding member, which is made from insulation resin 910 having a thermal conductivity larger than that of air and a metal cover 990, on the surface of the multilayer body 900, as illustrated in FIG. 4. As the insulation resin 910, epoxy resin to which fillers are added, urethane resin, bismaleimide triazine (BT) resin, etc. may be used, for example. Alternatively, it is possible to omit the shielding member.

Furthermore, the connection electrodes through which large currents flow and the connection electrodes through which the control signals are transmitted are provided in different layers. This arrangement makes the routing of each connection electrode easier, making it possible to reduce the area. Furthermore, mutual interference between the connection electrodes through which large currents flow and the connection electrodes through which the control signals are transmitted is prevented from occurring, and switching noises superimposed on the connection electrodes through which large currents flow are prevented from superimposing on the control signals, improving device reliability of the power supply control circuit module.

Furthermore, the heat dissipation efficiency from the conductive via holes also improves by arranging the conductive via holes, which are connected to the circuit elements and the connection electrodes through which large currents flow, near the periphery of the multilayer body 900. Furthermore, the heat dissipation efficiency further improves by increasing the number of these conductive via holes.

Furthermore, the heat dissipation efficiency further improves by arranging the external connection terminals, which are connected to the circuit elements and the connection electrodes through which large currents flow through the conductive via holes, as close to the periphery of the multilayer body 900 as possible. Particularly, the heat dissipation efficiency improves by arranging them the outermost periphery of the multilayer body 900.

Furthermore, a parasitic inductance of the capacitor element 31 is suppressed by connecting the other end of the capacitor element 31 to the inner-layer ground electrode 431 only by the conductive via hole, as illustrated in FIG. 4. Furthermore, although the arrangement is different from FIG. 4, the parasitic inductance is also be suppressed by connecting the other end of the capacitor element 31 to the external connection ground electrode 450(GA) only by the conductive via hole.

Figure 5:
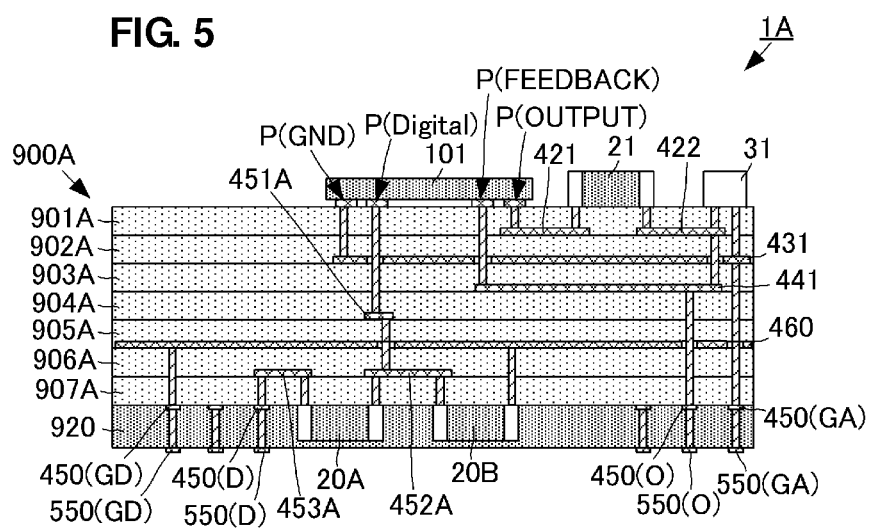
FIG. 5 is a side cross-sectional concept view for describing a multilayer structure of a power supply control circuit module according to a second preferred embodiment of the present invention.

A power supply control circuit module according to the second preferred embodiment is described with reference to the drawings. FIG. 5 is a side cross-sectional concept view for describing a multilayer structure of a power supply control circuit module 1A according to the second preferred embodiment. Note that, as is the case with FIG. 4, FIG. 5 does not illustrate a cross-section of a multilayer body 900A along a plane in the stacking direction. FIG. 5 is a view illustrating connection relationships among circuit elements, electrodes, and conductive via holes in an easily understandable form.

Furthermore, FIG. 5 also illustrates only the connection configuration on an output side of a DC-DC converter circuit that includes a switching regulator element 101. An output side circuit configuration of the switching regulator element 101 is substantially the same as that of the first preferred embodiment, and an explanation thereof is omitted. Furthermore, although no shielding member is included in FIG. 5, it is preferable to have a shielding member as with the power supply control circuit module 1 of the first preferred embodiment.

A Digital terminal of the switching regulator element 101 is connected to one end of a second inner-layer electrode 451A at a boundary between dielectric layers 904A and 905A through a conductive via hole that penetrates dielectric layers 901A, 902A, 903A, 904A. The other end of the second inner-layer electrode 451A is connected to a second inner-layer electrode 452A at a boundary between dielectric layers 906A and 907A through a conductive via hole that penetrates the dielectric layers 905A and 906A. The second inner-layer electrode 452A is connected to ends of circuit elements 20A and 20B that are mounted on a back surface of the multilayer body 900A through a conductive via hole that penetrates the dielectric layer 907A.

The other end of the circuit element 20B is connected to an inner-layer ground electrode 460 through a conductive via hole that penetrates the dielectric layers 906A and 907A. The other end of the circuit element 20A is connected to a second inner-layer electrode 453A at a boundary between the dielectric layers 906A and 907A through a conductive via hole that penetrates the dielectric layer 907A. The second inner-layer electrode 453A is connected to an external connection digital input terminal 450(D) at the back surface of the multilayer body 900A through a conductive via hole that penetrates the dielectric layer 907A.

Insulation resin 920 is provided on the back surface of the multilayer body 900A. The insulation resin 920 preferably has a thickness that is sufficient to cover the circuit elements 20A and 20B. Thus, external connection terminals 550 are provided on a back surface of the insulation resin 920, namely on a surface of the insulation resin 920 which is opposite to a side facing the multilayer body 900, for their respective external connection terminals 450 that are arranged in array. The external connection terminals 450 and the external connection terminals 550 are connected to each other through conductive via holes that penetrate the insulation resin 920. For example, an external connection ground terminal 450(GA) is connected to an external connection ground terminal 550(GA) through a conductive via hole that penetrates the insulation resin 920. An external connection digital ground terminal 450(GD) is connected to an external connection digital ground terminal 550(GD) through a conductive via hole that penetrates the insulation resin 920. An external connection digital input terminal 450(D) is connected to an external connection digital input terminal 550(D) through a conductive via hole that penetrates the insulation resin 920. An external connection output terminal 450(O) is connected to an external connection output terminal 550(O) through a conductive via hole that penetrates the insulation resin 920.

The external connection terminal 450 may be a metal pin or a terminal formed by forming a conductive film around an insulation member such as resin, etc., for example. The conductive film may be formed by plating a metal such as Au, Cu, etc., for example.

In the foregoing arrangement, the second inner-layer electrodes 452A, 453A as well as the second inner-layer electrode 451A have narrower widths. Furthermore, these second inner-layer electrodes 451A, 452A, 453A are located within a mounting area of a power supply control IC 10. Accordingly, even in the case where the circuit elements are included in a control signal transmission circuit, the power supply control circuit module according to the present preferred embodiment achieves heat dissipation effects while ensuring ease of routing the inner-layer electrodes as described above. Furthermore, according to the foregoing arrangement, the power supply control IC 10 and the digital transmission circuit elements 20A, 20B are mounted on opposite surfaces of the multilayer body 900A and separated from each other. Thus, noises generated from the power supply control IC 10 are prevented from propagating into the digital transmission circuit elements 20A and 20B, improving the device reliability of the power supply control circuit module.

In the foregoing preferred embodiments, the examples are described as preferably using the power supply control ICs which realize the DC-DC converter circuits. However, the foregoing arrangements of the connection electrodes, etc. may also be applicable to power supply control ICs including linear regulators or other power supply control ICs that output large currents.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power supply control circuit module comprising:
a power supply control IC element that controls a power supply output based on a control signal;
a multilayer body including a plurality of dielectric layers stacked on each other, on which the power supply control IC element and circuit elements are mounted, the circuit elements being connected to the power supply control IC element;
first inner-layer electrodes located between a mounting area of the power supply control IC element and a periphery of a surface of the multilayer body;
second inner-layer electrodes that transmit the control signal for the power supply control IC element; and
a shielding member including an insulating resin and a metal cover, arranged to shield the surface of the multilayer body, and having a thermal conductivity higher than a thermal conductivity of air; wherein
connection circuit electrodes are defined by the first inner-layer electrodes;
the first inner-layer electrodes and the second inner-layer electrodes are provided in different layers of the multilayer body;
the first inner-layer electrodes are provided in a layer that is closer to the surface of the multilayer body than a layer where the second inner-layer electrodes are provided;
the first inner-layer electrodes extend along a periphery of the multilayer body; and
the metal cover directly contacts side surfaces of the multilayer body which extend perpendicular to the surface of the multilayer body; and
the power supply control IC element is a DC-DC converter switching IC element, and of the circuit elements, an output capacitor is connected to an external ground connection terminal at one end thereof through a conductive via hole, the output capacitor being connected to an output side of the DC-DC converter switching IC element, the external ground connection terminal being one of external connection terminals on a back surface of the multilayer body.

2. A power supply control circuit module according to claim 1, wherein the multilayer body includes DC output terminals, and the first inner-layer electrodes are all electrically connected to the DC output terminals.

3. A power supply control circuit module according to claim 1, wherein cross-sectional areas of the first inner-layer electrodes are larger than cross-sectional areas of the second inner-layer electrodes.

4. A power supply control circuit module according to claim 2, wherein the circuit elements are connected in between the power supply control IC element and the DC output terminals and are mounted between the mounting area of the power supply control IC element and the periphery of the surface of the multilayer body, and the second inner-layer electrodes that transmit the control signal are located in the mounting area of the power supply control IC element.

5. A power supply control circuit module according to claim 1, wherein a plurality of external connection terminals are arrayed in a plurality of rows along the periphery of the multilayer body on a back surface of the multilayer body, and of the plurality of external connection terminals included in the array, external connection terminals that connect to the circuit elements and external connection terminals that connect to the first inner-layer electrodes are arranged at outermost positions.

* * * * *